United States Patent
Cheng et al.

(10) Patent No.: US 6,432,758 B1
(45) Date of Patent: Aug. 13, 2002

(54) RECRYSTALLIZATION METHOD OF POLYSILICON FILM IN THIN FILM TRANSISTOR

(75) Inventors: Huang-Chung Cheng, 2F, No. 14, Alley 2, Lane 86, Chien-Kung I Rd., Hsinchu; Ching-Wei Lin, Taoyuan Hsien; Li-Jing Cheng, Chanhwa, all of (TW)

(73) Assignee: Huang-Chung Cheng, Hsinchu (TW)

( * ) Notice: Subject to any disclaimer, the term of this patent is extended or adjusted under 35 U.S.C. 154(b) by 0 days.

(21) Appl. No.: 09/781,431

(22) Filed: Feb. 13, 2001

(51) Int. Cl.$^7$ .......................... H01L 21/00; H01L 21/84
(52) U.S. Cl. ................ 438/166; 438/149; 438/150; 438/482; 438/486; 438/487; 438/489
(58) Field of Search ................ 438/149–166, 438/482, 486, 487, 489

(56) References Cited

U.S. PATENT DOCUMENTS

| | | | |
|---|---|---|---|
| 5,207,863 A | * | 5/1993 | Kumomi .................... 117/8 |
| 5,512,494 A | * | 4/1996 | Tanabe .................... 438/161 |
| 5,893,948 A | * | 4/1999 | Nickel et al. ................ 117/43 |
| 6,093,586 A | * | 7/2000 | Gosain et al. ..... 148/DIG. 100 |
| 6,251,733 B1 | * | 6/2001 | Yamazaki .................... 438/153 |
| 6,329,270 B1 | * | 12/2001 | Voutsas ..................... 438/485 |
| 6,342,409 B1 | * | 1/2002 | Seo ............................ 438/161 |

FOREIGN PATENT DOCUMENTS

| | | | | |
|---|---|---|---|---|
| JP | 05152573 A | * | 6/1993 | ......... H01L/29/784 |
| JP | 05218025 A | * | 8/1993 | ....... H01L/21/3205 |

* cited by examiner

Primary Examiner—John F. Niebling
Assistant Examiner—Jennifer M. Kennedy
(74) Attorney, Agent, or Firm—Rosenberg, Klein & Lee

(57) ABSTRACT

The present invention proposes a crystallization method of the poly-Si thin film in a thin film transistor. A substrate having an insulator layer is provided. An amorphous silicon layer or a micro-crystalline silicon layer having two thickness is first formed on the insulator layer. The region of thinner is defined as the channel region of the TFT, while the region of thicker can be defined as the source/drain regions of the TFT. Next, an excimer laser is used for crystallization. During the excimer laser irradiation, the amorphous silicon layer of thinner is completely melted, and the amorphous silicon layer of thicker is partially melted. The partially melted amorphous silicon layer is used as crystallization seeds. Through formation of the temperature gradient between the completely melted amorphous silicon layer and the partially melted amorphous silicon layer, longitudinal growth of silicon grains in the completely melted region will be performed to grow a poly-Si layer having good homogeneity and large grains.

14 Claims, 7 Drawing Sheets

RECRYSTALLIZATION METHOD OF POLYSILICON FILM IN THIN FILM TRANSISTOR

FIELD OF THE INVENTION

The present invention relates to a fabrication method of thin film transistor liquid crystal display (TFT-LCD) and, more particularly, to a crystallization method of polysilicon (poly-Si) film in thin film transistors.

BACKGROUND OF THE INVENTION

General active-matrix LCDs can be divided into two types according to adopted material: one is poly-Si TFT type, and the other is amorphous silicon TFT type, wherein the poly-Si TFT type can provide higher reliability and reduce the cost because it can be integrated with driving circuits. Nonetheless, the main reason why the poly-Si TFT technology is highly commended is that the device size can be greatly reduced to achieve high resolution. In general, to massively product poly-Si TFT-LCDs with low-temperature (about 450~550° C.) fabrication technique, there are several essentials: low-temperature formation of high-quality poly-Si thin film and gate-insulator, large-area ion doping and activation technique, and hydrogenation technique.

For the formation of poly-Si thin film in a TFT-LCD, low temperature technique is adopted for thin film growth m consideration of price of glass substrate. Therefore, solid phase crystallization (SPC) is first introduced. However, its process temperature is still too high. The process temperature is about 600° C. and the crystallization quality is not good. Hence, excimer lasers are applied to the above low-temperature process of thin film crystallization. Generally speaking, because there is no specific crystalization direction for amorphous Si, very flat surface of amorphous silicon thin film can be deposited. Therefore, a layer of amorphous silicon thin film is first deposited and then crystallized into a poly-Si thin film using SPC or excimer lasers for fabricating poly-Si thin film transistors.

FIGS. 1 and 2 show a prior art fabrication flowchart of poly-Si thin film using excimer laser crystallization in a poly-Si TFT.

Firsty, please refer to FIG. 1, a substrate 100 having an insulator layer 102 thereon is provided. A flat amorphous silicon layer 104 is then formed on the insulator layer 102 by means of low-pressure chemical vapor deposition (LPCVD), plasma-enhanced chemical vapor deposition (PECVD), or sputtering.

Please refer to FIG. 2, after the amorphous silicon layer 104 is deposited, an excimer laser 108 of sufficient energy is used to crystallize amorphous silicon layer 104 to polycrystalline silicon. For acquiring large grain, amorphous silicon layer 104 is almost completely melted. Some non-melted amorphous silicon particles will remain at the interface between the amorphous silicon layer 104 and the insulator layer 102. Next, the melted amorphous silicon layer 104 will crystallize into a poly-Si layer 106 using the non-melted amorphous silicon particles as crystallization seeds. This poly-Si layer 106 is used as the source/drain region and channel region of the TFT.

In prior art, during the low-temperature crystallization procedure of amorphous silicon layer using an excimer laser, the energy density of the excimer laser must be carefully considered to let the amorphous silicon layer be almost completely melted while keeping the flatness of its surface. When the amorphous silicon layer is almost completely melted, some non-melted amorphous silicon particles will remain at the interface between the amorphous silicon layer and the insulator layer. The melted amorphous silicon layer will crystallize into a poly-Si layer using the non-melted amorphous silicon particles as discrete seeds. However, because the excimer layer is a kind of pulse laser, there will exist slight difference in energy density for each laser pulse. Because it is difficult to control the energy density of the excimer laser, if the energy density of the excimer laser is slightly larger than the ideal value, total melting of the amorphous silicon layer will easily arise, resulting in disappearance of discrete seeds which the crystallization process relies on. Therefore, grain growth will be homogeneous so that the grown grain is small and the homogeneity is bad, as shown in FIG. 13.

Contrarily, if the energy density of the excimer laser is slightly smaller than the ideal value, part of the amorphous silicon layer will not be melted, and the crystallizing grain will grow vertically using the non-melted amorphous silicon layer as the basis, resulting in the same drawbacks of small grain and bad homogeneity.

In prior art, during the crystallization procedure of poly-Si layer, the energy density of the excimer laser must be exactly controlled to let the amorphous silicon layer be almost completely melted and to keep some non-melted amorphous silicon particles remained as discrete seeds for crystallization. Thereby, better effect of crystallization can be obtained. However, because the excimer layer is a kind of pulse laser, there will exist slight difference in energy density for each laser pulse. Because it is difficult to control the energy density of the excimer laser, the process window will become very small.

The present invention aims to propose a method of using an excimer laser to let an amorphous silicon layer having different thickness crystallize into a poly-Si layer so that the above drawbacks of prior art can be overcome.

SUMMARY OF THE INVENTION

The present invention proposes a crystallization method of poly-Si thin film in the TFT. The proposed method is briefly described below.

A substrate having an insulator layer is provided. A layer of amorphous silicon having two thickness is first formed on the insulator layer. The region of thinner is defined as the channel region of the TFT, while the region of thicker can be defined as the source/drain regions of the TFT. Next, an excimer laser is used for crystallization. During the excimer laser irradiation, the amorphous silicon layer of thinner is completely melted, and the amorphous silicon layer of thicker is partially melted. The partially melted amorphous silicon layer is used as crystallization seeds. Through formation of the temperature gradient between the completely melted amorphous silicon layer and the partially melted amorphous silicon layer, longitudinal growth of silicon grains in the completely melted region will be performed to grow a poly-Si layer having good homogeneity and large grains.

The various objects and advantages of the present invention will be more readily understood from the following detailed description when read in conjunction with the appended drawings, in which:

DETAILED DESCRIPTION OF THE PREFERRED EMBODIMENTS

Please refer to FIGS. 3 to 7, which show a fabrication flowchart of poly-Si thin film served as channel region in a poly-Si TFT according to a preferred embodiment of the present invention.

Poly-Si TFTs can generally be divided into two types according to relative positions of their gate and source/drain regions: bottom gate poly-Si TFTs and top gate poly-Si TFTs. Generally speaking, the top gate poly-Si TFTs are more common structure. The present invention will be illustrated by means of this top gate structure.

Figure 1:
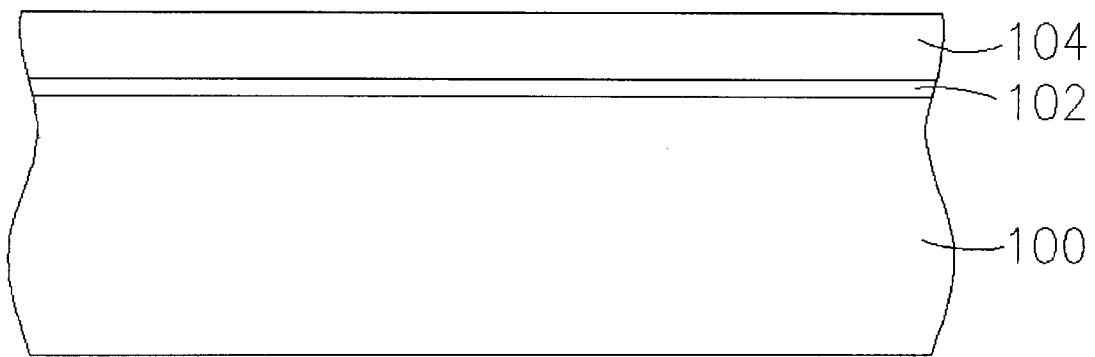
FIGS. 1 and 2 show a prior art fabrication flowchart of poly-Si thin film in a poly-Si TFT.
Figure 2:
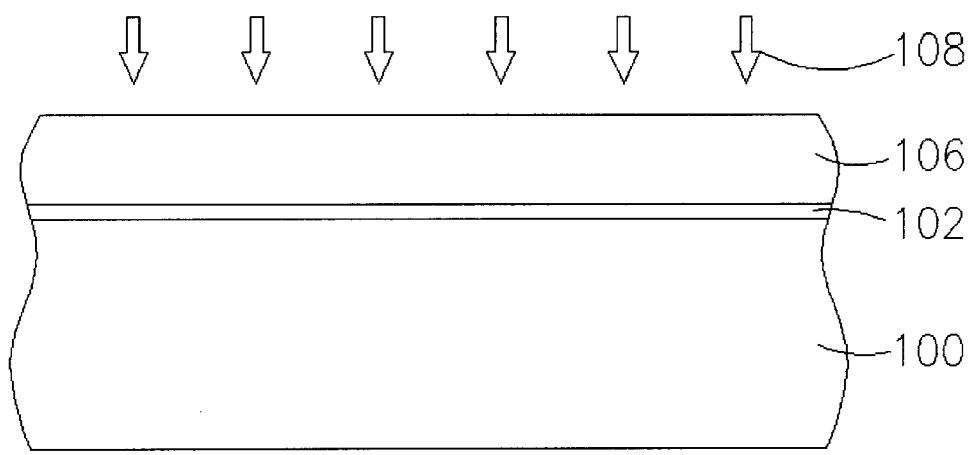
Figure 3:
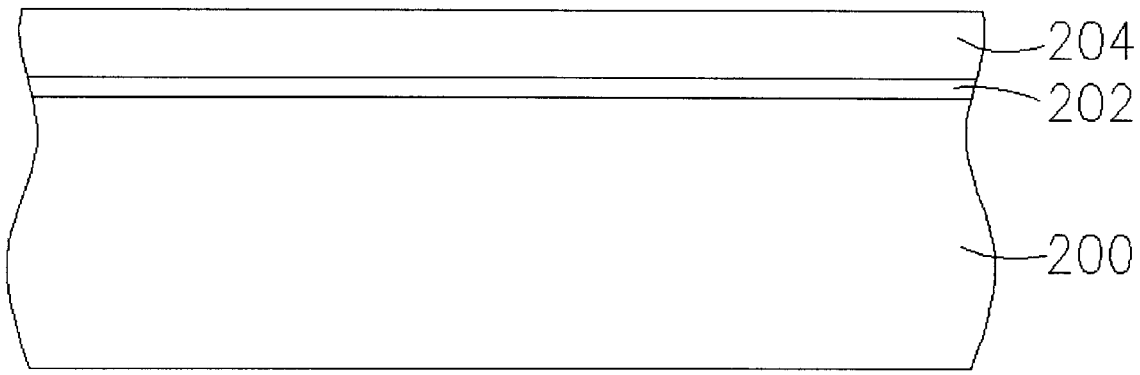
FIGS. 3 to 7 show a fabrication flowchart of poly-Si thin film served as channel region in a poly-Si TFT according to a preferred embodiment of the present invention.

Please refer to FIG. 3. Firstly, a substrate 200 such as a silicon wafer, a glass substrate, or a plastic substrate is provided. An insulator layer 202 is formed on the substrate 200. The insulator layer 202 can be formed by depositing a silicon oxide layer on the substrate 200 by means of LPCVD, PECVD, or sputtering. An amorphous silicon layer 204 is then formed on the insulator layer 202 by means of LPCVD, PECVD, or sputtering. The formed thickness is within the range of 20 nm to 2000 nm.

Figure 4:
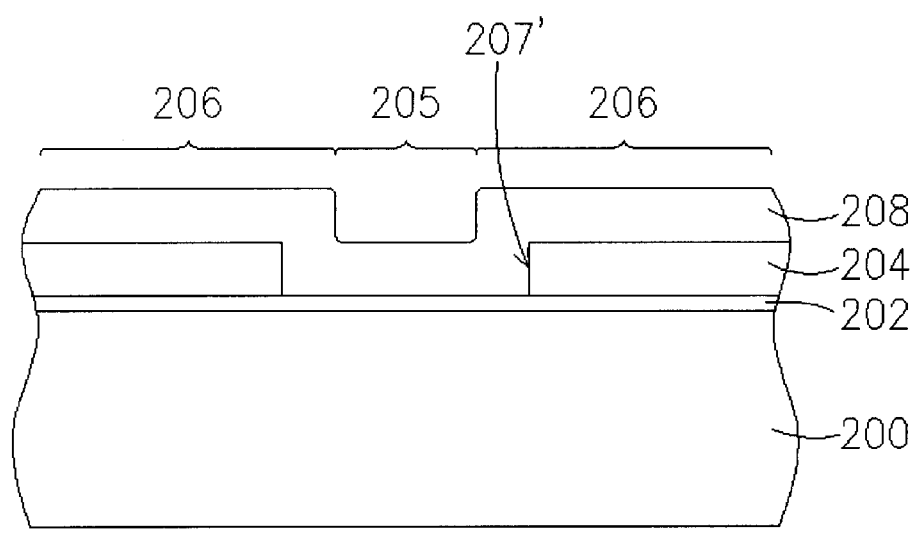
Figure 5:
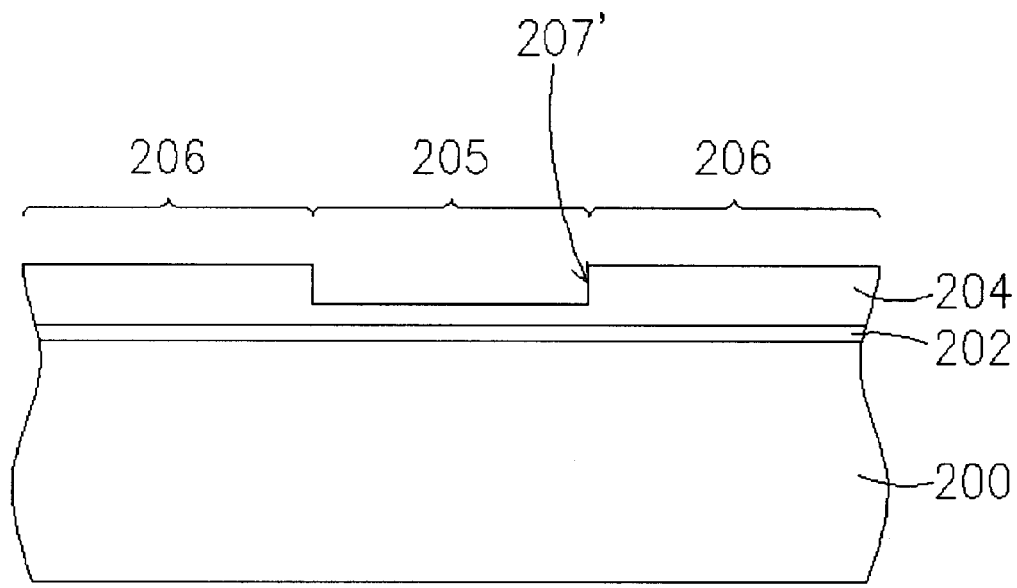

Please then refer to FIGS. 4 and 5. After the amorphous silicon layer 204 is deposited, part region thereof is removed to form a region 205 of thinner and a region 206 of thicker. There are two ways of forming regions of different thickness. One way is shown in FIG. 4. Part region of the amorphous silicon layer 204 is removed to expose the insulator layer 202 by means of etching so as to form an opening 207. A second amorphous silicon layer 208 is then formed to cover over the opening 207 and the amorphous silicon layer 204. Thereby, the amorphous silicon layer 204 and the second amorphous silicon layer 208 will form a region 205 of thinner and a region 206 of thicker. The other way is shown in FIG. 5. Part region of the amorphous silicon layer 204 is removed by means of etching while not exposing the insulator layer 202 thereunder so as to form an opening 207' in the amorphous silicon layer 204. Thereby, the amorphous silicon layer 204 will form a region 205 of thinner and a region 206 of thicker.

Figure 7:
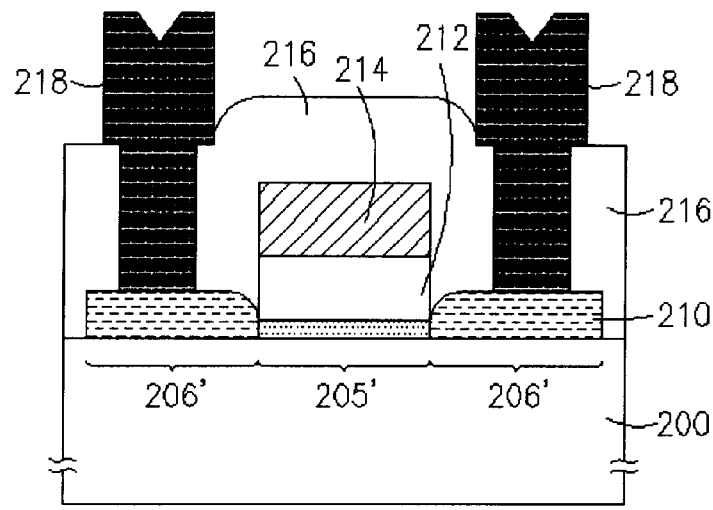

The amorphous silicon region 205 of thinner and the amorphous silicon region 206 of thicker formed in FIGS. 4 and 5 are subsequently crystallized into poly-Si so that they can be respectively used as the channel region 205' and the source/drain regions 206' of a TFT, as shown in FIG. 7.

Figure 6:
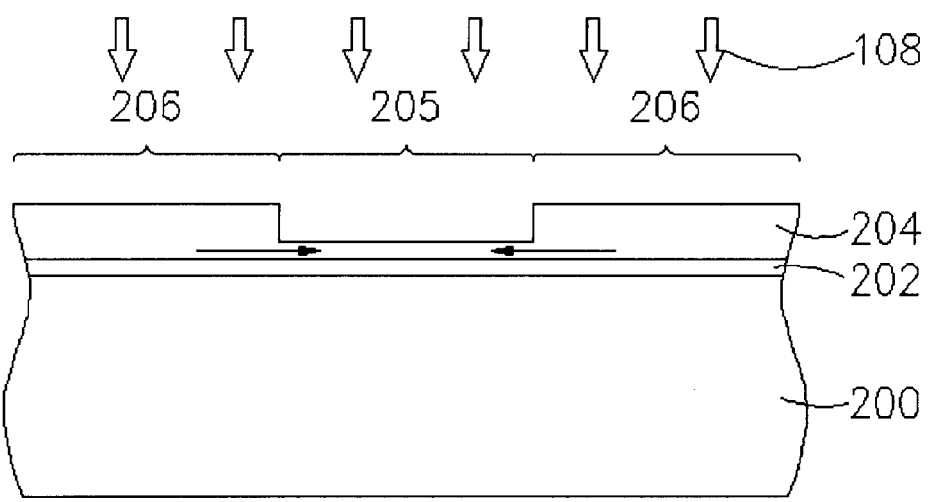
Figure 11:
FIG. 11 is a scanning electron microscopy (SEM) diagram showing the growth direction of grain crystallization can be controlled by the present invention.

Please next refer to FIGS. 6 and 11. An excimer laser 108 is irradiated on the amorphous silicon layer so that the amorphous silicon region 205 of thinner is completely melted, and the amorphous silicon region 206 of thicker is partially melted. The non-melted amorphous silicon can be used as crystallization seeds in the crystallization procedure. Thereby, the completely melted amorphous silicon region 205 of thinner will crystallize longitudinally into a poly-Si layer 210 (shown in FIG. 7). As can be seen from the SEM diagram in FIG. 11, the growth direction of silicon grains is longitudinal.

Please refer to FIG. 7. The formed poly-Si layer 210 after crystallization similarly has a region of thinner and a region of thicker. The region of thinner is used as the channel region 205', and the region of thicker is used as the source/drain regions 206'. Subsequently, an insulator layer 212 is formed on the channel region 205', and a gate conductive layer 214 is then formed on the insulator layer 212. Next, a dielectric layer 216 is formed to cover over the whole device. Finally, a source/drain (S/D) contact is formed, thereby completing the fabrication of a TFT.

Figure 8:
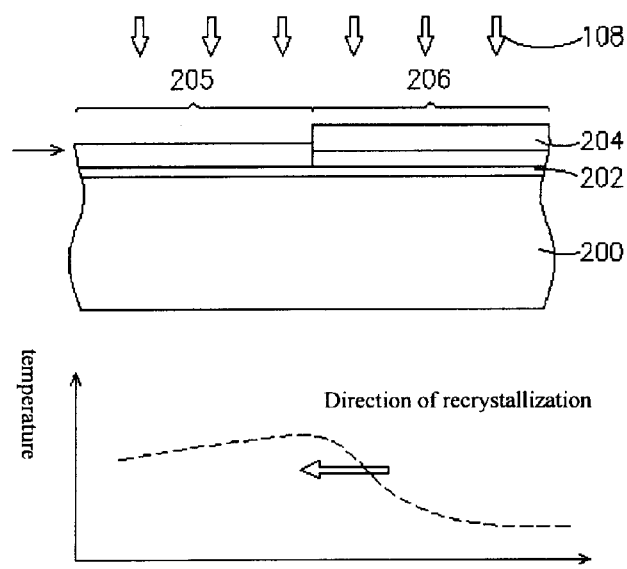
FIG. 8 is a diagram showing the distribution of the temperature gradient between the non-melted amorphous silicon part and the completely melted part of the amorphous silicon region of thinner according to a preferred embodiment of the present invention.
Figure 12:
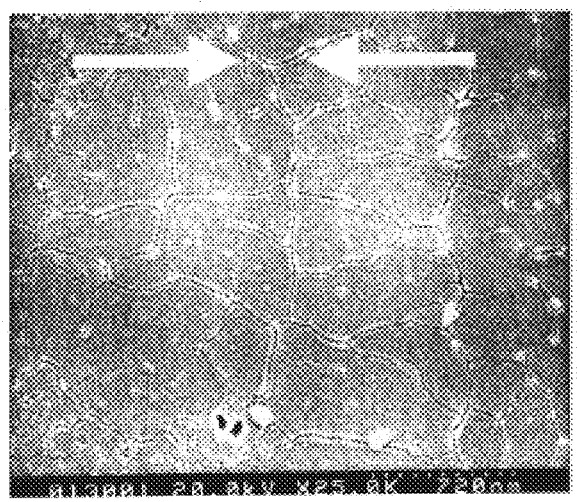
FIG. 12 is an SEM diagram showing high homogeneity of growth of grain crystallization can be obtained by the present invention.
Figure 13:
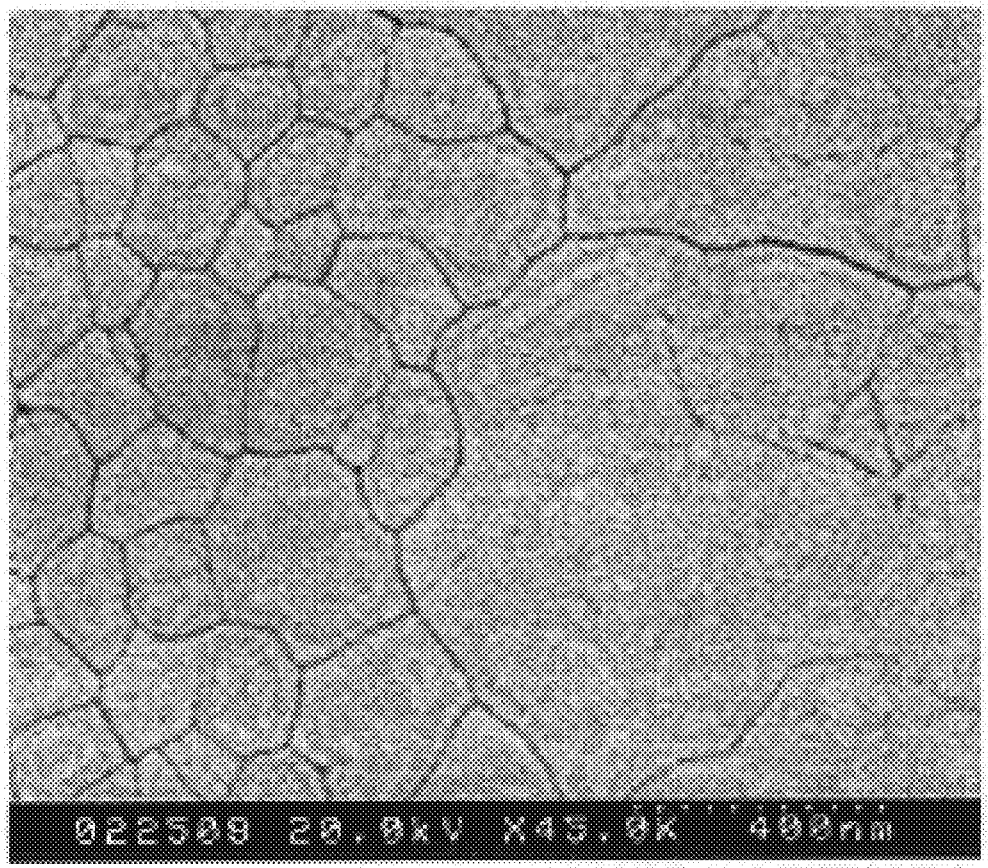
FIG. 13 is an SEM diagram showing bad homogeneity of growth of grain crystallization is obtained by the conventional method.

Please refer to FIGS. 8 and 12. Because only part of the amorphous silicon region 206 of thicker is melted, the non-melted amorphous silicon put has a lower temperature with respect to the melted amorphous silicon region 205 of thinner. Because there is a temperature difference between them, there exists a distribution of temperature gradient, as shown in FIG. 8. Through the help of this distribution of temperature gradient and the above longitudinal crystallization procedure, silicon grains having higher homogeneity and larger grains can be formed. Therefore, the characteristics of the TFT can be enhanced.

Figure 9:
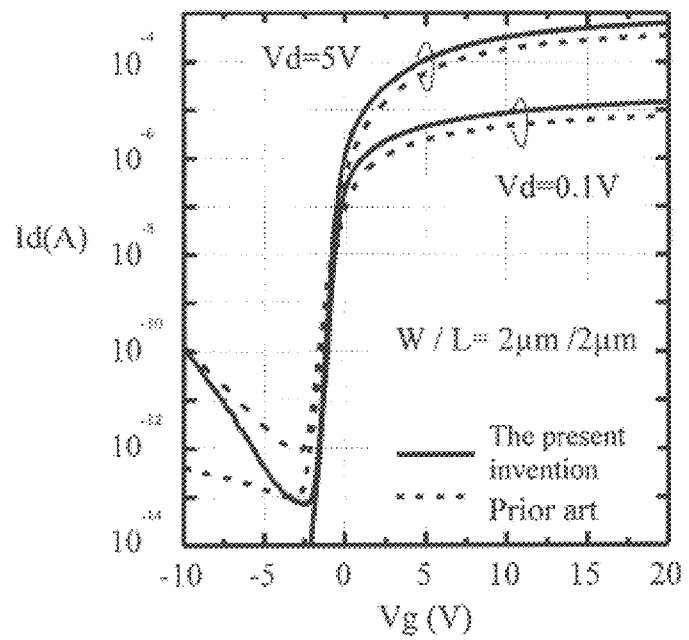
FIG. 9 is a diagram showing the transfer characteristics of poly-Si TFTs fabricated by the prior art and the present invention under different voltages.
Figure 10:
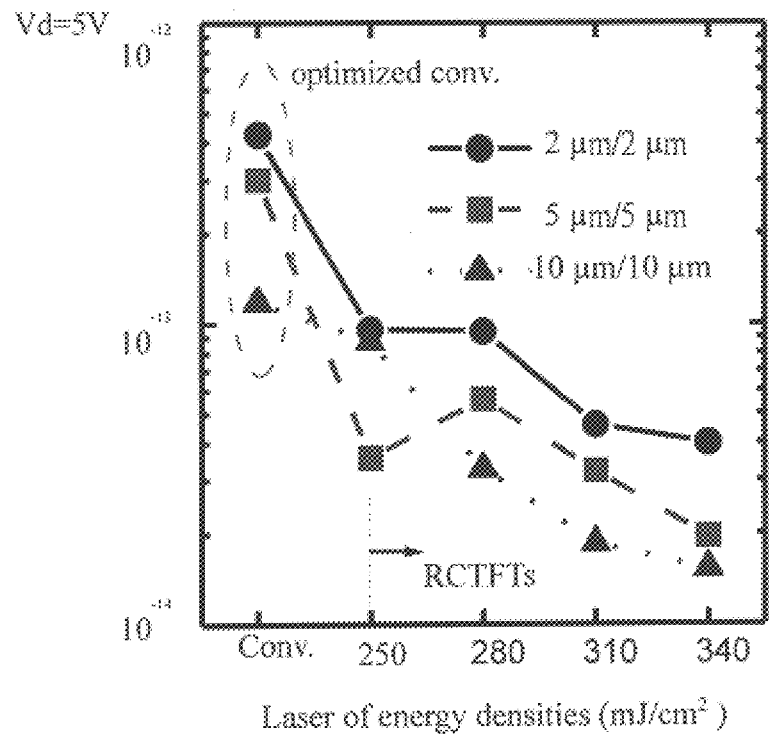
FIG. 10 is a diagram showing that different leakage currents of recrystallized film using the excimer laser of different energy densities for recrystallization will be obtained according to a preferred embodiment of the present invention.

Please refer to FIGS. 9 and 10. There exist differences between the characteristics of poly-Si films fabricated by the prior art and the present invention. For instance, the present invention can increase the mobility of carriers and reduce the leakage currents. The four curves in FIG. 9 represent the transfer characteristics of poly-Si TFTs under different voltages fabricated by the prior art and the present invention, respectively. As can be obviously seen from FIG. 9, the present invention has better transfer characteristics. The lines shown in FIG. 10 represent different leakage currents of poly-Si TFTs using the excimer laser 108 of different energy densities for crystallization, respectively. As can be known from the trend of the lines, the larger the energy density of the excimer laser 108 is used, the smaller the leakage current will appear. However, the prerequisite of energy density of the excimer laser is that the region 206 of thicker cannot be completely melted, and the ablation cannot happen at the region 205 of thinner. If the energy density of the excimer laser is too high the film will ablate accordingly. If the non-melted thickness of the region 206 of thicker is larger, the temperature gradient will be larger. However, it is undesirable to have a too thick region 206 of thicker in consideration of other process factors.

Therefore, the present invention is characterized in that an amorphous silicon layer of different thickness is provided. This amorphous silicon layer is then melted using an excimer laser, and the growth direction of poly-Si grains is controlled through this structure of different thickness.

The present invention is also characterized in that the temperature gradient resulted from the temperature difference between the melted amorphous silicon layer and the non-melted amorphous silicon layer is exploited to increase the size of the grown grains.

The present invention uses an amorphous silicon layer of two thickness to increase the process window and homogeneity of the crystallization process using an excimer laser.

In the above embodiments of the present invention, crystallization of the amorphous silicon layer into a poly-Si layer is described for illustration. However, the film material of the present invention is not limited to silicon. The present invention can also be applied to the crystallization process of other materials.

Although the above embodiments of the present invention are applied to the fabrication of TFTs, the present invention can also be applied to TFT-LCD, active-matrix organic light-emitting diodes (OLEDs), static random access memories (SRAM), three-dimensional integrated circuits (3-D ICs), sensors, printers, and light valves.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A crystallization method of the poly-Si thin film in a thin film transistor, comprising at least the steps of:
   providing a substrate;
   forming an insulator layer on said substrate;
   forming an amorphous silicon layer having a first thickness and a second thickness, said second thickness being larger than said first thickness;
   using an excimer laser to completely melt said amorphous silicon layer having said first thickness and to partially melt said amorphous silicon layer having said second thickness; and
   performing the crystallization procedure to form a poly-Si in film using said partially melted amorphous silicon layer as crystallization seeds.

2. The crystallization method of the poly-Si thin film in a thin film transistor as claimed in claim 1, wherein said step of forming said amorphous silicon layer having said first thickness and said second thickness comprises at least the steps of:
   forming a first amorphous silicon layer having a third thickness;
   removing said first amorphous silicon layer to expose said insulator layer so as to form an opening; and
   forming a second amorphous silicon layer having said first thickness on said opening and said amorphous silicon layer.

3. The crystallization method of the poly-Si thin film in a thin film transistor as claimed in claim 1, wherein said step of forming said amorphous silicon layer having said first thickness and said second thickness comprises at least the steps of:
   forming an amorphous silicon layer having said second thickness; and
   defining the position of an opening on said amorphous silicon layer and removing a depth of said amorphous silicon layer commensurately to said third thickness so as to form an opening.

4. The crystallization method of the poly-Si thin film in a thin film transistor as claimed in claim 2, wherein said second thickness equals to said first thickness plus said third thickness.

5. The crystallization method of the poly-Si thin film in a thin film transistor as claimed in claim 1, wherein said amorphous silicon layer having said first thickness is the channel region of the thin film transistor.

6. The crystallization method of the poly-Si thin film in a thin film transistor as claimed in claim 1, wherein said amorphous silicon layer having said second thickness is the source/drain regions of the thin film transistor.

7. The crystallization method of the poly-Si thin film in a thin film transistor as claimed in claim 1, wherein a temperature gradient exists between said amorphous silicon layer having said first thickness and said amorphous silicon layer having said third thickness.

8. A fabrication method of poly-Si thin film, comprising at least the steps of:
   providing a substrate;
   forming an insulator layer on said substrate;
   forming an amorphous silicon layer having a first thickness and a second thickness, said second thickness being larger than said first thickness;
   using an excimer laser to completely melt said amorphous silicon layer having said first thickness and to partially melt said amorphous silicon layer having said second thickness; and
   performing the crystallization procedure to form a poly-Si thin film using said partially melted amorphous silicon layer as crystallization seeds.

9. The fabrication method of poly-Si thin film as claimed in claim 8, wherein said step of forming said amorphous silicon layer having said first thickness and said second thickness comprises at least the steps of:
   forming a first amorphous silicon layer having a third thickness;
   removing said first amorphous silicon layer to expose said insulator layer so as to form an opening; and
   forming a second amorphous silicon layer having said first thickness on said opening and said amorphous silicon layer.

10. The fabrication method of poly-Si thin film as claimed in claim 8, wherein said step of forming said amorphous silicon layer having said first thickness and said second thickness comprises at least the steps of:
    forming an amorphous silicon layer having said second thickness; and
    defining the position of an opening on said amorphous silicon layer and removing a depth of said amorphous silicon layer commensurately to said third thickness so as to form an opening.

11. The fabrication method of poly-Si thin film as claimed in claim 9, wherein said second thickness equals to said first thickness plus said third thickness.

12. The fabrication method of poly-Si thin film as claimed in claim 8, wherein said amorphous silicon layer having said first thickness is the channel region of the thin film transistor.

13. The fabrication method of poly-Si thin film as claimed in claim 8, wherein said amorphous silicon layer having said second thickness is the source/drain regions of the thin film transistor.

14. The fabrication method of poly-Si thin film as claimed in claim 8, wherein a temperature gradient exists between said amorphous silicon layer having said first thickness and said amorphous silicon layer having said third thickness.

* * * * *